United States Patent [19]
Kitazawa et al.

[11] Patent Number: 6,057,600
[45] Date of Patent: May 2, 2000

[54] STRUCTURE FOR MOUNTING A HIGH-FREQUENCY PACKAGE

[75] Inventors: Kenji Kitazawa; Shinichi Koriyama; Shigeki Morioka; Satoru Tomie, all of Kokubu, Japan

[73] Assignee: Kyocera Corporation, Kyoto, Japan

[21] Appl. No.: 09/199,716

[22] Filed: Nov. 25, 1998

[30] Foreign Application Priority Data

| Nov. 27, 1997 | [JP] | Japan | 9-326778 |
| Mar. 12, 1998 | [JP] | Japan | 10-061075 |
| Apr. 28, 1998 | [JP] | Japan | 10-118212 |
| Apr. 28, 1998 | [JP] | Japan | 10-118213 |
| Jun. 30, 1998 | [JP] | Japan | 10-183938 |

[51] Int. Cl.[7] .............. H05K 1/00; H01L 23/12; H01L 23/00
[52] U.S. Cl. .......... 257/728; 257/691; 257/758; 257/701; 257/700; 257/738; 257/777; 257/778
[58] Field of Search .......... 257/678, 728, 257/738, 737, 777, 778, 690, 691, 700, 701, 758

[56] References Cited

U.S. PATENT DOCUMENTS

| 4,827,327 | 5/1989 | Miyauchi et al. | 257/728 |
| 4,875,087 | 10/1989 | Miyauchi et al. | 257/664 |
| 5,122,856 | 6/1992 | Komiya | 257/774 |
| 5,264,729 | 11/1993 | Rostoker et al. | 257/774 |
| 5,283,081 | 2/1994 | Kata et al. | 427/96 |
| 5,400,220 | 3/1995 | Swamy | 174/264 |
| 5,406,125 | 4/1995 | Johnson et al. | 257/774 |
| 5,483,421 | 1/1996 | Gedney et al. | 361/771 |
| 5,502,397 | 3/1996 | Buchanan | 324/754 |
| 5,510,758 | 4/1996 | Fujita et al. | 333/247 |
| 5,543,661 | 8/1996 | Sumida | 257/707 |
| 5,639,989 | 6/1997 | Higgins, III | 174/35 MS |
| 5,703,394 | 12/1997 | Wei et al. | 257/433 |
| 5,832,598 | 11/1998 | Greenman et al. | 29/840 |
| 5,835,357 | 11/1998 | Swamy et al. | 361/764 |
| 5,869,903 | 3/1999 | Nakatani et al. | 257/777 |
| 5,929,510 | 7/1999 | Geller et al. | 257/635 |
| 5,932,926 | 8/1999 | Maruyama et al. | 257/728 |

*Primary Examiner*—Alexander Oscar Williams
*Attorney, Agent, or Firm*—Loeb & Loeb, LLP

[57] ABSTRACT

A structure for mounting a high-frequency device on an insulating board having a circuit on a top surface and transmitting signals to the high-frequency device. The high-frequency device is sealed within a cavity on a top surface of a dielectric board. The dielectric board has a first signal transmission line on its top surface and a second signal transmission line on its bottom surface, the first and second signal transmission lines overlapping each other over a portion where the signal is transmitted through coupling of the first and second signal transmission lines. A recess is formed at the top surface of the insulating board below the overlapping portion of the first and second signal transmission lines to suppress transmission loss of the high-frequency signal between the first and second signal transmission lines. The recess may be filled with air or a material having a dielectric constant low than that of the insulating board.

12 Claims, 12 Drawing Sheets

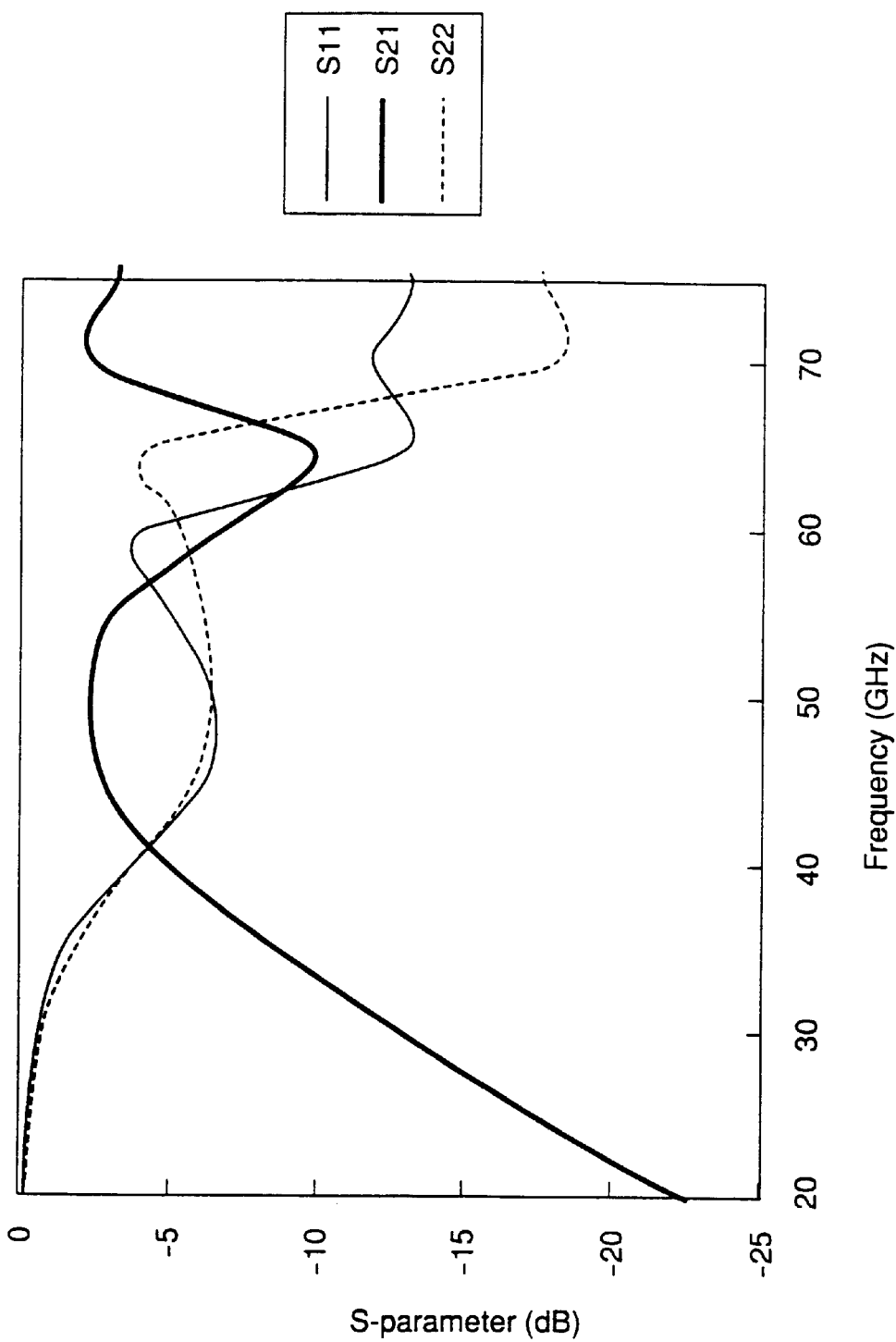

STRUCTURE FOR MOUNTING A HIGH-FREQUENCY PACKAGE

BACKGROUND OF THE INVENTION

1. Field of the Invention

The present invention relates to a mounting structure for connecting, to an external circuit board, a high-frequency package in which is mounted a semiconductor element that operates in a high-frequency region of from a microwave band to a millimeter-wave band (hereinafter often referred to as high-frequency element). More specifically, the invention relates to a mounting structure in which a high-frequency signal can be transmitted with a small loss.

2. Description of the Prior Art

In a high-frequency package mounting a high-frequency element, in general, the high-frequency element is held in a cavity formed in the surface of a dielectric board, and the cavity is air-tightly closed with a closure. On the surface of the dielectric board is further formed a signal transmission line such as a strip line electrically connected to the high-frequency element, and the high-frequency signals are input to, or output from, the high-frequency element through the signal transmission line.

In the high-frequency package, furthermore, the signal transmission line on the surface of the dielectric board is drawn toward the outside of the cavity from the inside of the cavity through the side wall of the closure of the cavity. Furthermore, the line that is drawn is folded on the side surface of the dielectric board, drawn along the bottom surface of the dielectric board, and is connected to a terminal for connection to an external circuit board (mother board). Moreover, a via-hole conductor is formed to penetrate through the dielectric board, and the signal transmission line on the surface of the board is connected to the connection terminal on the bottom surface of the board through the via-hole conductor. That is, the connection terminal provided on the bottom surface of the dielectric board is connected to the wiring layer of the external circuit board using an adhesive such as solder, in order to mount the high-frequency package on the external circuit board. Owing to such a mounting structure, the high-frequency signals are input to the high-frequency element from the external circuit board or are output from the high-frequency element to the external circuit board through the signal transmission line.

In the above-mentioned structure for mounting the high-frequency package, however, there occurs a problem in that the transmission characteristics are deteriorated due to mismatching of the impedance, reflection loss and radiation loss of the transmission signals at a portion where the signal transmission line is passed through the side wall of the closure. Even when the signal transmission line is connected to the connection terminal by using the via-hole conductor that penetrates through the dielectric board, the transmission characteristics are still deteriorated due to mismatching of the impedance caused by the via-hole conductor.

In order to solve the above-mentioned problems, Japanese Unexamined Patent Publications (Kokai) Nos. 250911/1996, 250913/1996 and 186268/1997 propose high-frequency packages in which the signal transmission line is also formed on the bottom surface of the dielectric substrate, and is coupled, relying upon the electromagnetic coupling, to a signal transmission line that is connected to the high-frequency element on the surface of the dielectric board.

Referring to FIG. 11 which is a sectional view schematically illustrating a high-frequency package of a prior art, a cavity 43 is formed in the surface of a dielectric board 41, the cavity 43 being air-tightly sealed with a closure 42 made of an electromagnetic wave-shielding material such as a metal, and a high-frequency element 44 is mounted in the cavity 43. An input line 45a and an output line 45b are formed on the surface of the dielectric board 41, and are electrically connected to the high-frequency element 44. Furthermore, an input line 46a and an output line 46b are formed on the bottom surface of the dielectric board 41, and a ground layer 48 having a pair of slots 47a, 47b is formed in the dielectric board 41. As will be obvious from FIG. 11, the ends of the input lines 45a and 46a are opposed to each other with the slot 47a interposed therebetween, and are electromagnetically coupled together via the slot 47a. The ends of the output lines 45b, 46b are opposed to each other with the slot 47b being interposed therebetween, and are electromagnetically coupled together via the slot 47b.

Furthermore, connection portions 49a, 49b are formed at the ends of the input line 46a and the output line 46b on the bottom surface of the dielectric board 41, and the high-frequency package is mounted on the external circuit board by using these connection portions. That is, the external circuit board has a wiring layer with an input line 51a and an output line 51b formed on the surface of the insulating board 50. The high-frequency package is mounted on the external circuit board by connecting the connection portions 49a and 49b to the input line 51a and to the output line 51b by using an electrically conducting adhesive such as a solder as designated at 52a, 52b.

According to the above mounting structure, therefore, high-frequency signals are input to the high-frequency element 44 through the line 51a-line 46a-slot 47a-line 45a, and high-frequency signals are output from the high-frequency element 44 through the line 45b -slot 47b-line 46b-line 51b.

With the structure for mounting the high-frequency package according to the above-mentioned prior art, however, high-frequency signal transmission characteristics are deteriorated when the insulating board constituting the external circuit board has a dielectric constant of not smaller than 7. Therefore, the above-mentioned mounting structure could not be used in high-frequency regions. That is, the high-frequency package of the above-mentioned prior art could be mounted on the external circuit board constituted by an insulating board having a particular dielectric constant only.

With the mounting structure shown in FIG. 11, furthermore, the high-frequency element mounted on the package was not allowed to exhibit its characteristics to a sufficient degree particularly when the signals in the millimeter-wave band are to be treated. For example, when the transmission characteristics of millimeter-wave signals are measured between the line 51a and the line 51b at the ends of the input and output transmission lines, it is learned that the insertion loss is so great that isolation characteristics are not maintained to a sufficient degree. The isolation characteristics between the signal transmission lines tend to decrease, too, even when the package is connected by soldering to the external circuit board at positions 52a, 52b in the regions close to the electromagnetically coupled portions through the slots.

In the above-mentioned package, furthermore, a via-hole conductor and a metal band may be provided in the dielectric board in order to radiate heat to the external side from the portion on where the high-frequency element is mounted or in order to enhance the isolation characteristics. When they are provided in a region close to the slot, however, resonance occurs to deteriorate transmission characteristics between the signal transmission lines.

SUMMARY OF THE INVENTION

It is therefore an object of the present invention to provide a structure for mounting a high-frequency package which makes it possible to select an insulating board from a wide range to constitute an external circuit board and which does not deteriorate high-frequency signal transmission characteristics even for the external circuit board provided with the insulating board made of a material having a dielectric constant of not smaller than, for example, 7.

Another object of the present invention is to provide a structure for mounting a high-frequency package on an external circuit board featuring improved high-frequency signal isolation characteristics between the input line and the output line.

According to the present invention, there is provided a structure for mounting a high-frequency package containing a semiconductor element that operates in a high-frequency region and that is mounted on a cavity formed in a dielectric board, said high-frequency package being mounted on an external circuit board having a wiring layer formed on a surface of an insulating board, wherein:

a first signal transmission line is formed on a surface of said dielectric board so as to be electrically connected to said semiconductor element;

a second signal transmission line is formed on a bottom surface of said dielectric board so as to be coupled to said first signal transmission line;

an end of said second signal transmission line is connected to the wiring layer of said external circuit board; and a recessed portion is formed in the surface of the insulating board of said external circuit board in a region opposed to a portion where said first signal transmission line and said second signal transmission line are coupled together.

According to the present invention, the first signal transmission line and the second signal transmission line can be coupled together by using via-hole conductors that are so formed as to penetrate through the dielectric board. Particularly preferably, however, the first signal transmission line and the second signal transmission line are electromagnetically coupled together through slots formed in a ground layer formed in the dielectric board, since this is free from signal transmission loss that stems from the via-hole conductors.

In the present invention, the most important feature resides in the formation of recessed portions in the surface of the insulating board of the external circuit board opposed to the portions where the first signal transmission line and the second signal transmission line are coupled together. That is, the dielectric constant of the recessed portion is 1 (dielectric constant of the air=1) which is very smaller than a dielectric constant of a material constituting the insulating board. Upon forming the recessed portions, therefore, there takes place no sudden change in the effective dielectric constant or the characteristic impedance in the portions where the lines are electromagnetically coupled together or in the microstrip lines formed by the above-mentioned lines, or in the parasitic inductance near the via-hole conductors used for connecting the lines. Accordingly, the transmission characteristics are not deteriorated. Despite the insulating board of the external circuit board is made of a material having a dielectric constant of not smaller than 7, therefore, the high-frequency signals are effectively transmitted. When the first signal transmission line and the second signal transmission line are electromagnetically coupled together through the slots, the dielectric constant of the insulating board of the external circuit board greatly affects the high-frequency signal transmission characteristics. Therefore, the present invention is most effective in mounting a high-frequency package that employs the above-mentioned electromagnetically coupling system.

In the present invention, furthermore, the recessed portions may extend up to the back side of the insulating board penetrating therethrough so far as the recessed portions are formed in a predetermined size in the surface of the insulating board opposed to the portions where the first signal transmission line and the second signal transmission line are coupled together. Moreover, the recessed portions may be filled with a material having a dielectric constant smaller than that of a material constituting the insulating board. Upon filling the material having a small dielectric constant, it is allowed to avoid a drop in the strength of the insulating board.

According to the present invention, furthermore, when the first line and the second line are electromagnetically coupled together, it is desired that via-hole conductors or metal bands connected to the ground layer in the dielectric board of the package are formed in a region separated by more than a predetermined distance from the above-mentioned electromagnetically coupled portions. When the via-hole conductors and the like are formed in such a region, the electromagnetic coupling is not affected by the via-hole conductors or the like, whereby isolation characteristics are enhanced, and the characteristics of the high-frequency element are exhibited to a sufficient degree.

BRIEF DESCRIPTION OF THE DRAWINGS

FIG. 13 is a diagram illustrating the transmission characteristics of a structure (Comparative Example) for mounting the high-frequency package on the external circuit board prepared according to Experiment 2.

DETAILED DESCRIPTION OF THE INVENTION

The present invention will now be described in detail by way of embodiments shown in the accompanying drawings.

Figure 1:
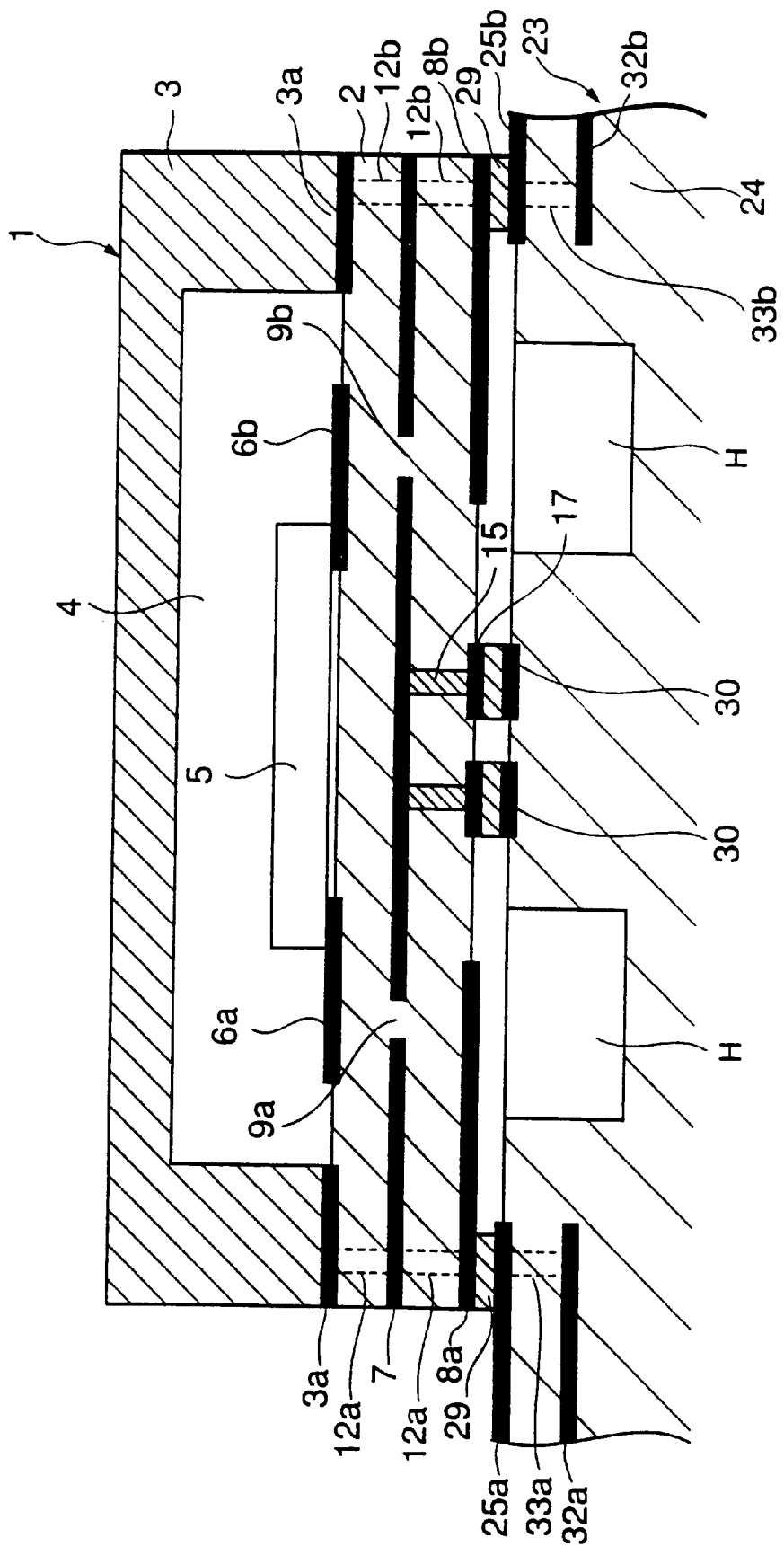
FIG. 1 is a sectional view schematically illustrating a structure for mounting a high-frequency package on an external circuit board according to the present invention.

FIG. 1 is a sectional view schematically illustrating the structure for mounting a high-frequency package on an external circuit board according to the present invention. In FIG. 1, the high-frequency package 1 is equipped with a dielectric board 2, and a closure 3 is brazed onto the upper surface of the board 2 (reference numeral 3a denotes an electrically conducting layer formed by brazing). Therefore, a cavity 4 is formed being air-tightly sealed with the closure 3. A high-frequency element 5 such as MMIC or MIC is mounted in the cavity 4. The closure 3 is made of an electromagnetic wave-shielding material capable of preventing the electromagnetic waves from leaking to the external side, such as metal, ceramics, ceramics-metal composite material, glass ceramics or glass-organic resin composite material. It is, of course, allowable to form the closure 3 by using an electromagnetic wave-transmitting material, and to apply the above-mentioned electromagnetic wave-shielding material onto the surface thereof.

A first signal transmission line constituted by a first input line 6a and a first output line 6b, is formed on the surface of the dielectric board 2 in the cavity 4, and the ends of the lines 6a and 6b are electrically connected to the high-frequency element 5. The connection can be accomplished by bonding the wires or by using ribbons or tapes. Relying upon the flip-chip mounting, furthermore, the high-frequency element 5 can be directly counted on the ends of the lines 6a and 6b.

A ground layer 7 is formed over the whole area in the dielectric board 2, and a pair of slots 9a and 9b are formed in the ground layer 7. That is, no electrically conducting layer is formed in the slots 9a and 9b.

A second signal transmission line constituted by a second input line 8a and a second output line 8b, is formed on the bottom surface of the dielectric board 2. These lines 8a and 8b are arranged on the same straight line. As will be obvious from FIG. 1, the other end of the first input line 6a (end of the side to which the high-frequency element 5 is not connected) is opposed to an end of the second input line 8a with the slot 9a formed in the ground layer 7 (hereinafter often called input-slot) being sandwiched therebetween, and the other end of the first output line 6b is opposed to the end of the second output line 8b with the other slot 9b (hereinafter often called output-slot) being sandwiched therebetween.

As will be understood from the above-mentioned structure of the high-frequency package 1, the first signal transmission line (input line 6a, output line 6b) on the upper surface of the dielectric board 2 is forming a microstrip line together with the ground layer 7, and the second signal transmission line (input line 8a, output line 8b) on the bottom surface of the dielectric board 2 is forming a microstrip line together with the ground layer 7. Furthermore, the first input line 6a and the second input line 8a are electromagnetically coupled together through the input-slot 9a, and the first output line 6b and the second output line 8b are electromagnetically coupled together through the output-slot 9b. That is, the first signal transmission line formed on the upper surface of the dielectric substrate 2 has been electromagnetically coupled to the signal transmission line formed on the bottom surface. Accordingly, high-frequency signals are input to the high-frequency element 5 through, for example, second input line 8a-slot 9a-first input line 6a, and high-frequency signals are output from the high-frequency element 5 through first output line 6b-slot 9b-second output line 8b.

The structure for electromagnetically coupling the first signal transmission line and the second signal transmission line will now be described with reference to a portion where the first input line 6a and the second input line 8a are coupled together.

Figure 2:
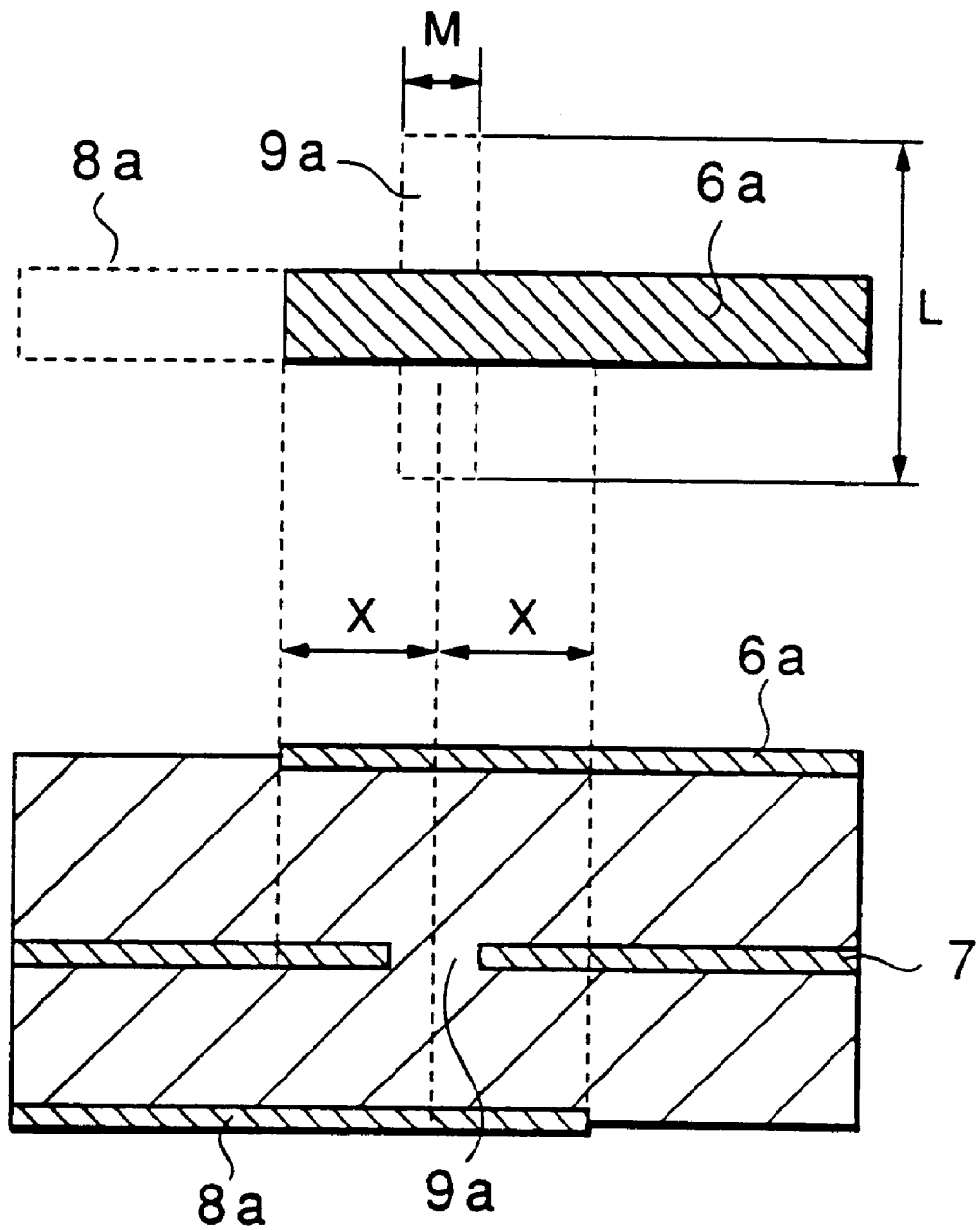
FIG. 2 is a diagram illustrating, on an enlarged scale, a portion where a first input line and a second input line of the package of FIG. 1 are electromagnetically coupled together.

Referring to FIG. 2 illustrating the electromagnetically coupled portion on an enlarged scale, the input-slot 9a has a rectangular shape having a long side L and a short side M. The slot 9a, however, may be of an oval shape having a long axis L and a short axis M. It is desired that the slot 9a has a long side L that corresponds to one-half the wavelength $\lambda$ of the transmission signals and has a short side M that corresponds to $\frac{1}{5}$ to $\frac{1}{50}$ of the wavelength $\lambda$ of the transmission signals from the standpoint of enhancing the signal transmission efficiency. The end of the first input line 6a and the end of the second input line 8a are protruded by a length x beyond the center of the slot 9a, and it is desired that the protruded length x is nearly equal to about $\frac{1}{4}$ of the wavelength $\lambda$ of the transmission signals. It is desired that the lengths L, M and X maintain quite the same relationship even when the slot 9a has an oval shape, and it is further desired that quite the same relationship is maintained even in the portion where the first output line 6b and the second input line 8b are electromagnetically coupled together.

Figure 3:
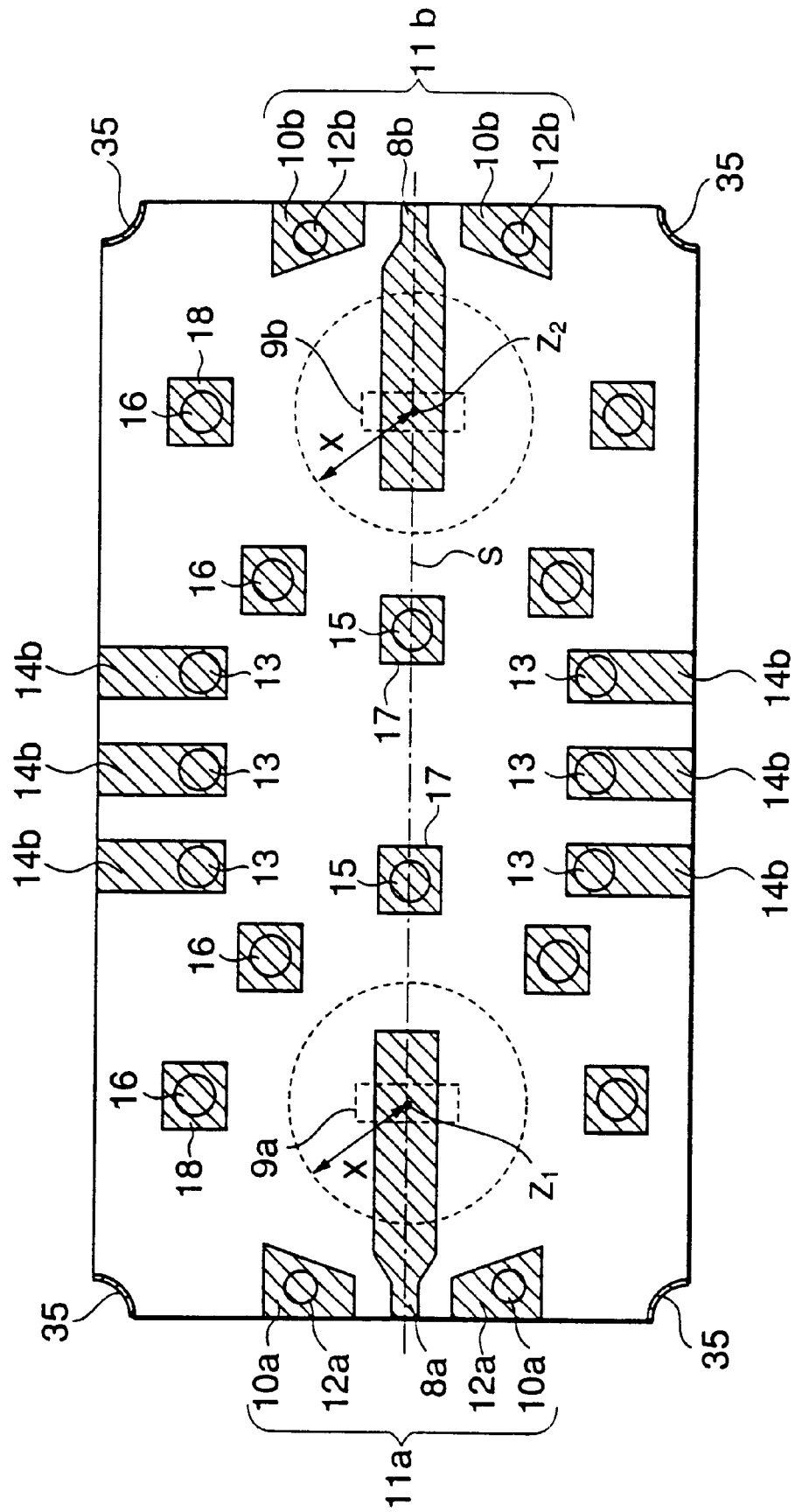
FIG. 3 is a diagram illustrating a wiring pattern on the bottom surface of a dielectric board of the package of FIG. 1.

Referring to FIG. 3 illustrating the wiring pattern on the bottom surface of the dielectric board 2, the second input line 8a and the second output line 8b are so formed as to be positioned on the same straight line. Ground layers 10a, 10b are formed on both sides of the ends of these lines 8a and 8b (ends of the sides opposite to the electromagnetically coupled portions). That is, connection portions 11a, 11b of coplanar lines with ground are formed by the ends of the lines 8a, 8b and by the ground layers 10a, 10b. The connection portions 11a and 11b are used for connecting the high-frequency package 1 to the external circuit board 23 such as a printed board that will be described later.

Figure 4:
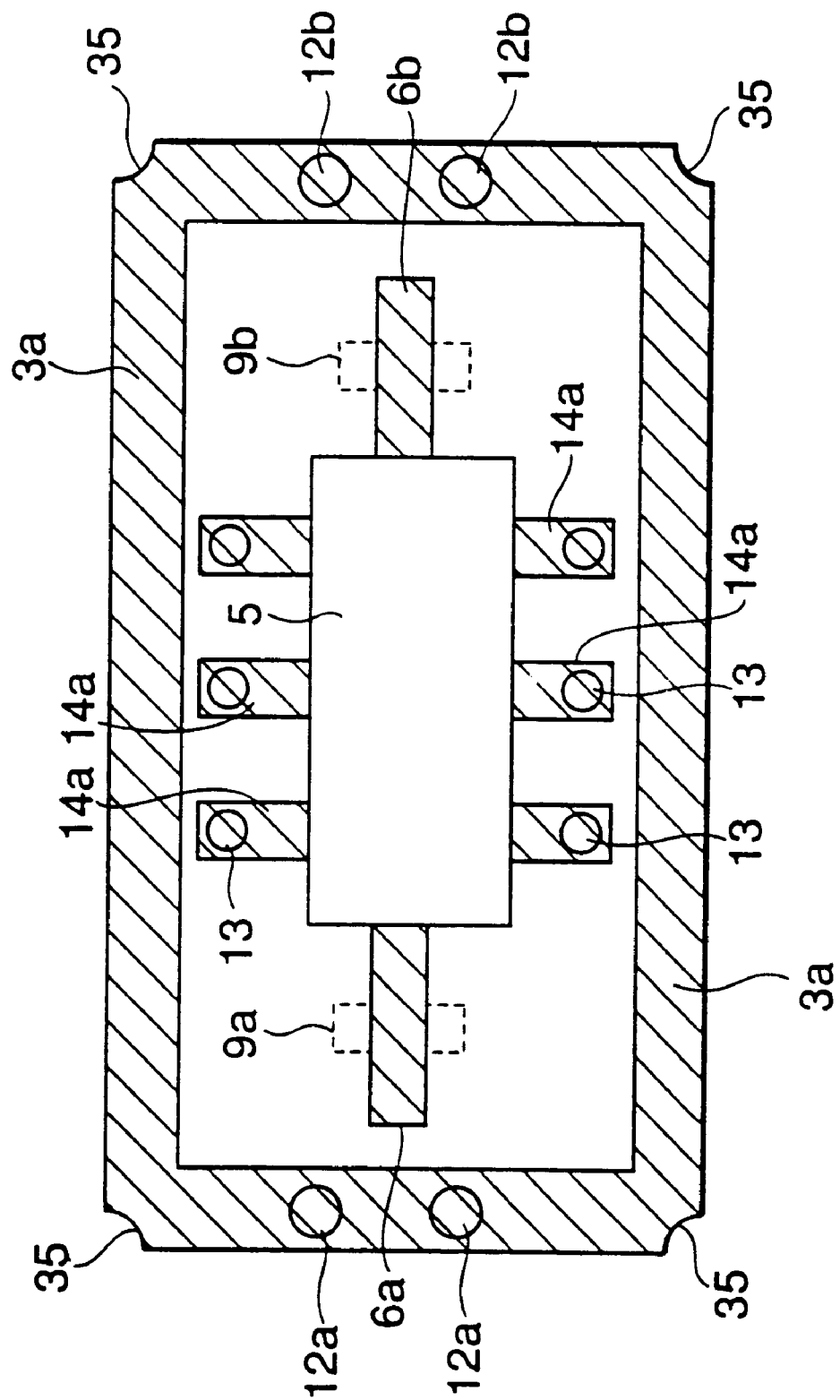
FIG. 4 is a diagram illustrating a wiring pattern on the upper surface of the dielectric board of the package of FIG. 1.

Referring, further, to FIG. 4 illustrating a wiring pattern on the upper surface of the dielectric board 2, wiring layers 14a for supplying electric power to the high-frequency element 5 are formed on the surface of the dielectric board 2 in the cavity 4, the wiring layers 14a for supplying electric power being connected to power source connection pads 14b formed on the bottom surface of the dielectric board 2 passing through the via-hole a conductors 13 formed in the dielectric board 2 (see FIGS. 1 and 3).

Reverting to FIG. 3, the input-slot 9a and the output-slot 9b formed in the ground layer 7 are so located that the centers $Z_1$, $Z_2$ thereof are separated from each other by not smaller than 2 L (L=length of the long sides of the slots) and, particularly, by not smaller than 3L. That is, with the input-slot 9a and the output-slot 9b being separated apart from each other as described above, the via-hole conductors and the metal bands for improving the isolation characteristics can be formed so will not to adversely affect the electromagnetic coupling accomplished through these slots 9a, 9b.

As shown in FIGS. 1 and 3, there can be provided at least one via-hole conductor 15 (two via-hole conductors are shown in FIGS. 1 and 3) connected to the ground layer 7 in a region between the end of the second input line 8a and the end of the second output line 8b in order to improve isolation characteristics. In this case, the two via-hole conductors 15 are positioned on a straight line S connecting the ends of the lines 8a and 8b, and the via-hole conductors 15 are separated from the centers $Z_1$, $Z_2$ of the slots 9a, 9b by not smaller than L. That is, as will become obvious from an Experiment that will be described later, the via-hole conductors 15 are formed at positions separated away by not smaller than L from the centers $Z_1$, $Z_2$ of the slots 9a, 9b, and the isolation characteristics are enhanced without adversely affecting the electromagnetic coupling performance. When the distance is smaller than L, the electromagnetic coupling performance is lost, and the high-frequency signal transmission characteristics are deteriorated.

According to the present invention as particularly shown in FIG. 3, furthermore, the dielectric board 2 is provided with a plurality of via-hole conductors 16 electrically connected to the ground layer 7 so as to surround the above-mentioned electromagnetically coupled portions to prevent the leakage of electromagnetic waves from the electromagnetically coupled portions. It is desired that the via-hole conductors 16, too, are formed at positions separated away from the centers $Z_1$, $Z_2$ of the slots 9a, 9b by not smaller than L. This makes it possible to prevent the leakage of electromagnetic waves from the electromagnetically coupled portion without impairing the electromagnetic coupling performance. The gaps among the via-hole conductors are set to be not longer than ¼ of the wavelength of the high-frequency signals that are to be transmitted.

The via-hole conductors 15, 16 are connected at their upper ends to the ground layer 7. As shown in FIG. 3, however, it is desired that their lower ends are connected to electrically conducting pads 17, 18 formed on the bottom surface of the dielectric board 2. In this case, the electrically conducting pads 17 and 18, too, are formed at positions separated away from the centers $Z_1$, $Z_2$ of the slots 9a, 9b by not smaller than L.

Figure 5:
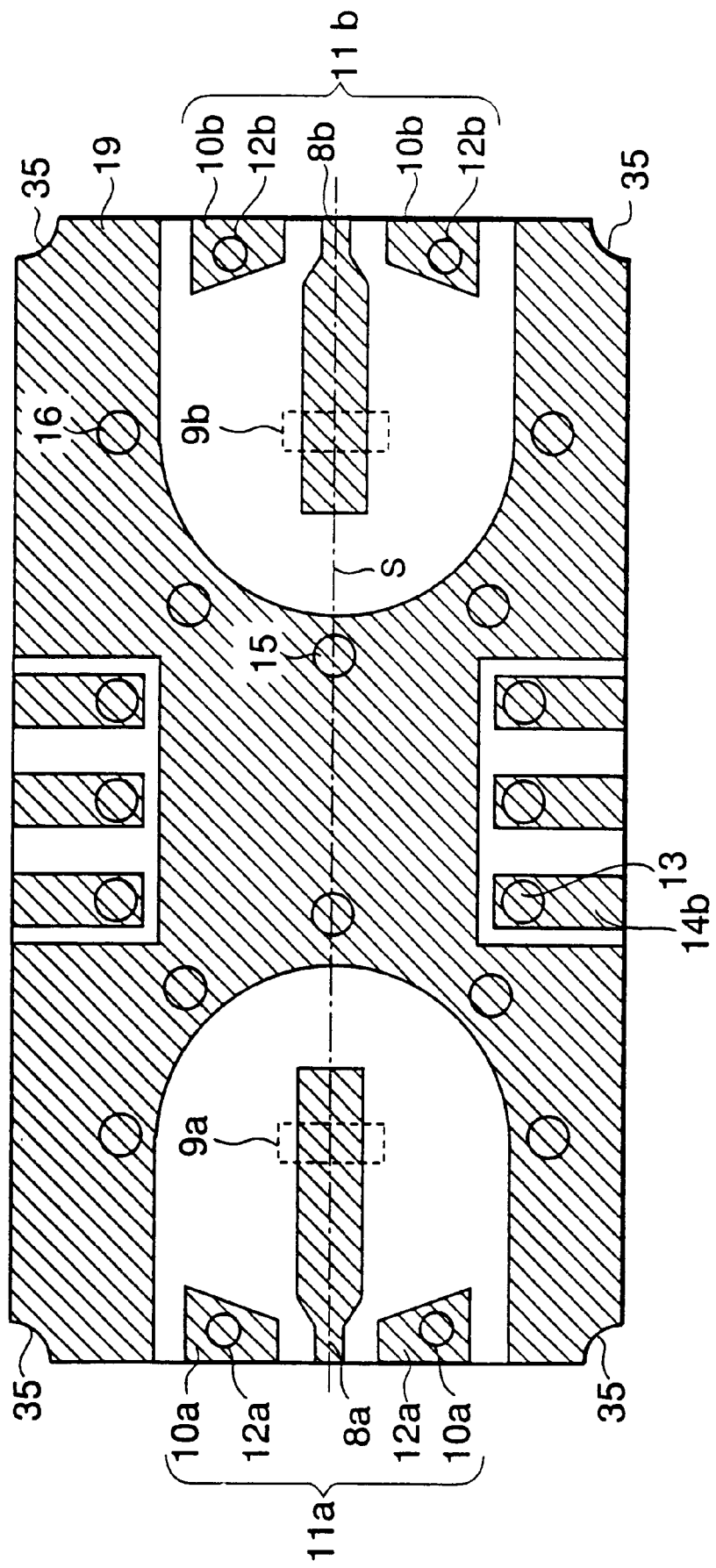
FIG. 5 is a diagram illustrating another wiring pattern on the bottom surface of the dielectric board of the package of FIG. 1.

Referring to FIG. 5 illustrating another wiring pattern on the bottom surface of the dielectric board 2, a ground layer 19 is provided on the bottom surface and from which are removed the regions within the distance of at least L from the centers $Z_1$, $Z_2$ of the slots 9a, 9b. The via-hole conductors 15 arranged on a straight line S connecting the ends of the lines 8a, 8b, and the via-hole conductors 16 arranged to surround the electromagnetic coupling portions, can be connected to the ground layer 19.

According to the present invention as will be obvious from FIGS. 3 and 5, it is desired that the members that affect the electromagnetic coupling performance, such as via-hole conductors, wiring layers, electrically conducting pads or junction portions to the external circuit boards, are not formed near the portions electromagnetically coupled to the lines 6a, 6b formed on the front surface of the dielectric board 2 and to the lines 8a, 8b formed on the back surface of the dielectric board 2, i.e., are not formed in the regions within at least L from the centers $Z_1$, $Z_2$. This makes it possible to maximize the transmission characteristics.

Figure 6:
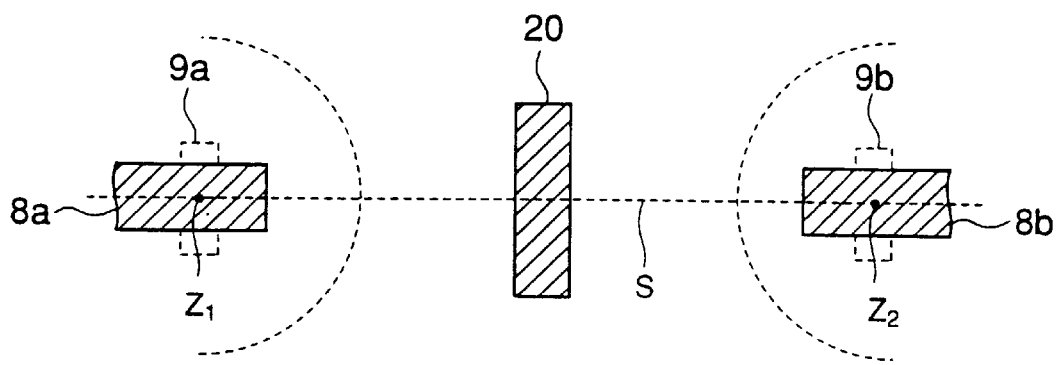
FIG. 6 is a diagram illustrating a further wiring pattern in a region of the electromagnetically coupled portion on the bottom surface of the dielectric board of the package of FIG. 1.

As shown in FIG. 6, furthermore, a metal band 20 may be formed by filling an elongated hole with a conductor to substitute for the two via-hole conductors arranged on the straight line S connecting the ends of the lines 8a and 8b. The upper end of the metal band 20 is connected to the ground layer 7, and is provided to span across the straight line S connecting the ends of the lines 8a and 8b as shown in FIG. 6. It is, of course, necessary that the metal band 20 is formed at a position separated away by not smaller than L from the centers $Z_1$, $Z_2$ of the slots 9a, 9b. It is also allowable to provide the above-mentioned metal bands to substitute for the via-hole conductors 16 that are formed to surround the electromagnetically coupled portions.

Figure 7:
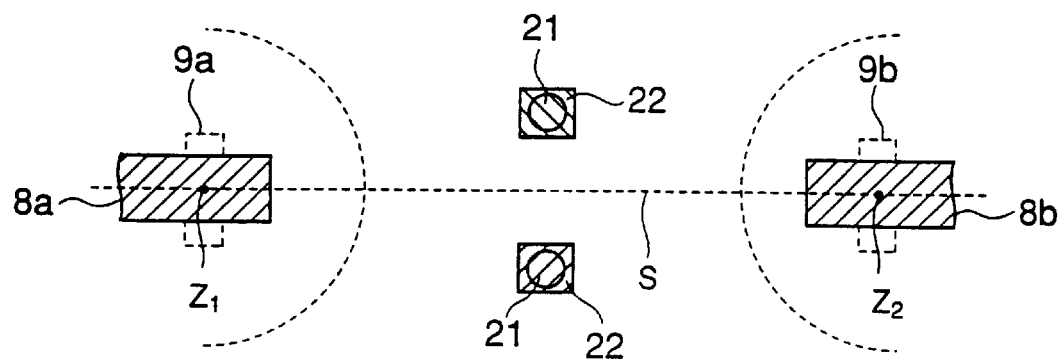
FIG. 7 is a diagram illustrating a still further wiring pattern in the region of the electromagnetically coupled portion on the bottom surface of the dielectric board of the package of FIG. 1.

In the embodiments of FIGS. 3 and 5, the two via-hole conductors 15 are arranged on the straight line S connecting the ends of the lines 8a and 8b. As shown in FIG. 7, however, the two via-hole conductors 21 may be opposed to each other with the straight line S being sandwiched therebetween to substitute for the via-hole conductors 15. The upper ends of the via-hole conductors 21 are connected to the ground layer 7, and the lower ends thereof are connected to the conducting pads 22. The via-hole conductors 21, too, are formed at positions separated away by not smaller than L from the centers $Z_1$, $Z_2$. It is further desired that the gap between the two via-hole conductors 21 is smaller than ¼ of the wavelength of the transmission signals so as to shield the electromagnetic waves from the electromagnetically coupled portions.

Reverting to FIG. 1, the external circuit board 23 on which the high-frequency package 1 is mounted, comprises an insulating board 24, a third input line 25a and a third output line 25b formed on the surface thereof. With reference to FIG. 1 as well as FIG. 8 which illustrates the wiring pattern on the surface of the external circuit board 23, there are formed ground layers 26, 27 on both sides of the third input line 25a and the third output line 25b. Furthermore, ground layers 32a, 32b are formed in the insulating board 24, and coplanar lines with ground are formed by these ground layers 26, 27, 32a, 32b and the lines 25a, 25b. Wiring layers 28 for power source are also formed on the surface of the insulating board 24.

According to the present invention, the high-frequency package 1 can be mounted on the external circuit board 23 by joining the connection portions 11a, 11b (see FIG. 3) comprising the second input line 8a, ground layers 10a, the second output lines 8b and ground layers 10b to connect portions comprising the third input line 25a, the ground layers 26, the third output line 25b and the ground layers 27 of the external circuit board 23 using an electrically conducting adhesive 29 such as a solder.

It is further desired that the electrically conducting pads 17 (to which the via-hole conductors 15 are connected) and the electrically conducting pads 18 (to which the via-hole conductors 16 are connected) formed on the bottom surface of the dielectric board 2 of the high-frequency package 1, are connected to the electrically conducting pads 30 formed on the surface of the insulating board 24 opposed to the above-mentioned electrically conducting pads by using an electrically conducting adhesive such as a solder. The above-mentioned constitution permits the transmission characteristics to be little deteriorated and enhances the isolation between the input line and the output line.

As a matter of course, a connection pad 14b (connected to the power feeding wiring layer 14a via the through-hole conductor 13) formed on the bottom surface of the high-frequency package 1, is electrically connected to the wiring layer 28 for power source by using the electrically conducting adhesive.

Figure 8:
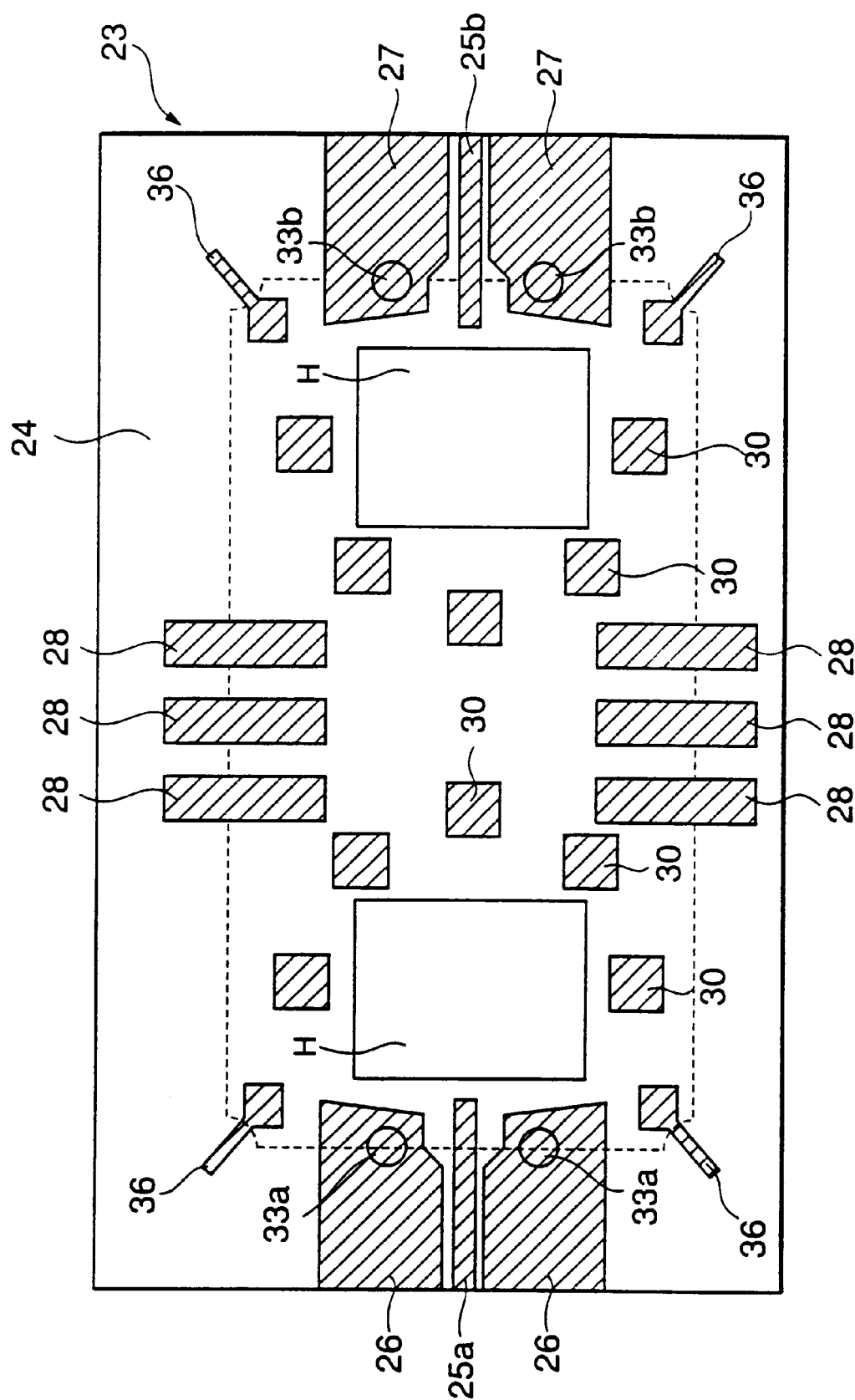
FIG. 8 is a diagram illustrating a wiring pattern on the surface of the external circuit board of FIG. 1.

In the above-mentioned structure for mounting the high-frequency package 1 on the external circuit board 23 as will be understood from FIGS. 1 and 8, it is very important to form recessed portions H in the surface of the external circuit board 23 (insulating board 24) opposed to the electromagnetically coupled portions of the high-frequency package 1. In the recessed portions H, the dielectric constant is 1 (which is the dielectric constant of the air). Even when the insulating board 24 is made of a material having a large dielectric constant (e.g., not smaller than 7), there does not take place a sudden change in the effective dielectric constant or in the characteristic impedance of the electromagnetically coupled portion of the high-frequency package 1 compared with that of the external circuit board 23. Accordingly, the transmission characteristics are little deteriorated, and high-frequency signals are effectively transmitted. The size of the recessed portion H differs depending upon the frequency of the transmission signals. When the frequency is 60 GHz, in general, the recessed portion H desirably has a width of 1.0 to 3.0 mm and a depth of not smaller than 0.3 mm. So far as a sufficiently large size is maintained, furthermore, the recessed portion H may penetrate through up to the back surface of the insulating board 24. Moreover, the recessed portion H may be filled with a material having a dielectric constant smaller than that of the material constituting the insulating board 24, i.e., may be filled with a material having a dielectric constant of not larger than 3 and, particularly, not larger than 2.7. Experiments of the material having such a small dielectric constant include fluorine-contained resin such as polytetrafluoroethylene (PTFE), a polyphenylene ether (PPE) resin, and an inorganic powder such as of quartz. Among them, the fluorine-contained resin is desirable. The recessed portion H filled with the material having a small dielectric constant makes it possible to effectively prevent a drop in the strength of the insulating board 24.

In the above-mentioned mounting structure of the present invention, it is desired that the ground layers 10*a* and 10*b* in the connection portions 11*a*, 11*b* formed on the bottom surface of the dielectric board 2 (see FIG. 3), are connected to the ground layer 7 formed in the dielectric board 2 through the via-hole conductors 12*a*, 12*b* and are maintained at the same potential. It is further desired that the electrically conducting layers 3*a* adhering the closure 3 onto the surface of the dielectric board 2, too, are connected to the via-hole conductors 12*a*, 12*b*, so that the ground layer 7 and the closure 3 are maintained at the same potential.

As will be obvious from FIGS. 1 and 8, furthermore, it is desired that the ground layers 26, 27 (formed on both sides of the third lines 25*a*, 25*b*) on the surface of the insulating board 24 are connected to the ground layers 32*a*, 32*b* in the insulating board 24 through the via-hole conductors 33*a*, 33*b*, and are maintained at the same potential as the ground layers 32*a*, 32*b*.

In order to enhance the connection performance between the second lines 8*a*, 8*b* on the bottom surface of the high-frequency package 1 and the third lines 25*a*, 25*b* on the surface of the external circuit board 23, furthermore, it is desired that the via-hole conductors 12*a*, 12*b* connected to the ground layers 10*a*, 10*b* of the package 1 and the via-hole conductors 33*a*, 33*b* connected to the ground layers 26, 27 on the surface of the external circuit board 23, are arranged on the straight lines via the electrically conducting adhesive 29. That is, as shown in FIG. 1, it is desired that the via-hole conductor 12*a* and the via-hole conductor 33*a* are positioned on the same straight line, and the via-hole conductor 12*b* and the via-hole conductor 33*b* are positioned on the same straight line.

If described with reference to the input lines, the second input line 8*a* formed on the bottom surface of the package 1 is constituting a microstrip line together with the ground layer 7 in the dielectric board 2. On the other hand, the third input line 25*a* on the surface of the external circuit board 23 is constituting a microstrip line together with the ground layer 32*a* in the insulating board 24. High-frequency signals are transmitted through these microstrip lines. Here, however, since the ground layer 7 and the ground layer 32*a* are positioned on different planes, the reflection loss occur in the portion where these microstrip lines are joined together, and the transmission characteristics are deteriorated. By connecting the ground layer 7 and the ground layer 32*a* through the shortest conducting passage, however, the reflection loss can be effectively decreased in the junction portion. In order to improve the transmission characteristics, therefore, it is desired that the via-hole conductor 12*a* and the via-hole conductor 33*a* are arranged on the same straight line. Similarly, it is desired that the via-hole conductor 12*b* and the via-hole conductor 33*b* are arranged on the same straight line.

Figure 9:
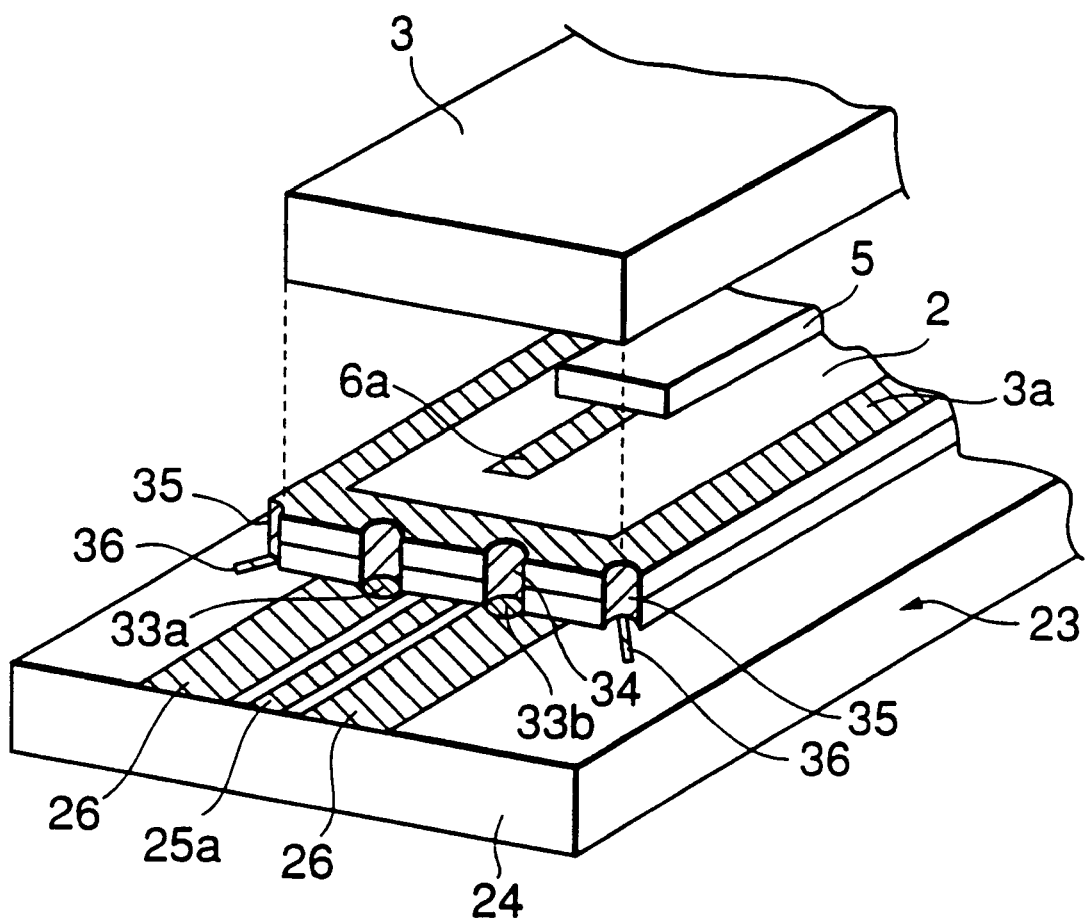
FIG. 9 is a perspective view illustrating, partly in cross section, the structure for mounting of FIG. 1 of when the side surface of the dielectric board is castellated.

According to the present invention as shown in FIG. 9, furthermore, electrically conducting cut-away portions (castellations) 34 may be formed in the side surface of the dielectric board 2 to substitute for the via-hole conductors 12*a*, 12*b*, in order to connect the ground layer 7, ground layers 10*a*, 10*b* and conducting layer 3*a* together, and to connect the ground layer 7 to the ground layers 26, 27 on the surface of the insulating board 24 through the electrically conducting cut-away portions 34. In this case, the electrically conducting cut-away portions 34 also serve as marks for mounting the package 1 on the external circuit board 23, making it possible to enhance the positional precision at the time of mounting. It is further possible to form electrically conducting cut-away portions 35 at the corners of the dielectric board 2, and to form positioning metal layers 36 on the surface of the insulating board 24 so as to be corresponded to the cut-away portions 35, in order to further enhance the mounting precision.

In the above-mentioned mounting structure of the present invention, the lines 6*a*, 6*b* formed on the surface of the dielectric board 2 and the lines 8*a*, 8*b* formed on the bottom surface of the dielectric board 2 are electromagnetically coupled together through the slots 9*a*, 9*b*. Owing to the formation of recessed portions H in the insulating board 24 of the external circuit board 23 at predetermined positions, however, the transmission characteristics can be enhanced even when there is mounted a high-frequency package in which the lines are connected via the through-hole conductors.

Figure 10:
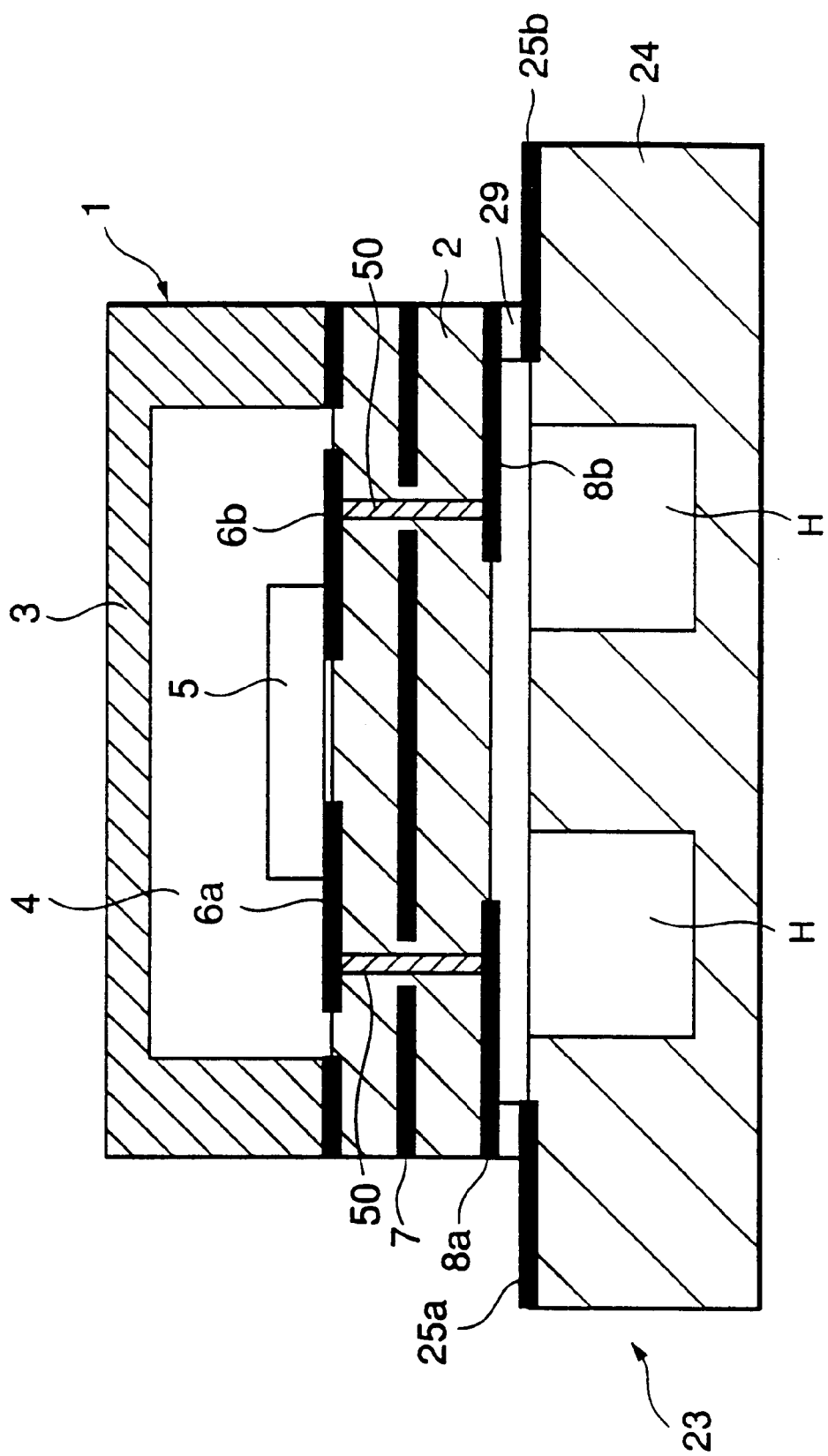
FIG. 10 is a sectional view schematically illustrating another structure for mounting the high-frequency package on the external circuit board according to the present invention.
Figure 11:
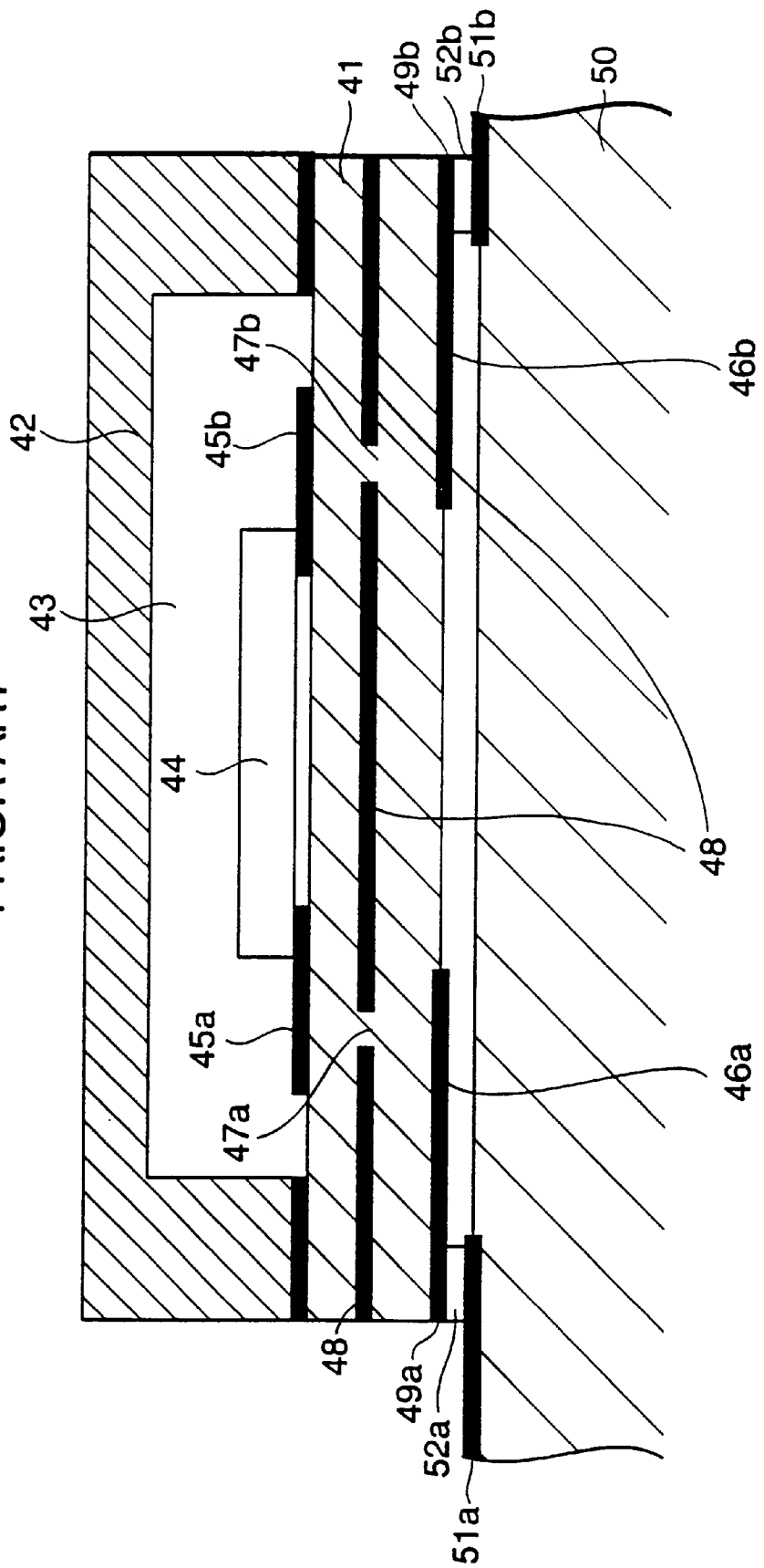
FIG. 11 is a sectional view schematically illustrating a widely known structure for mounting a high-frequency package on an external circuit board.

That is, in the mounting structure shown in FIG. 10, the first input line 6*a*, the first output line 6*b* formed on the surface of the dielectric board 2 are electrically connected to the second input line 8*a*, the second output line 8*b* formed on the back surface of the dielectric board 2 due to through-hole conductors 50 penetrating through the dielectric board 2. Even when the high-frequency package 1 having such a connection structure is to be mounted, recessed portions H are formed in the surface of the insulating board 24 of the external circuit board 23 at positions opposed to the connection by the via-hole conductors 50, in order to prevent a sudden change in the parasitic inductance around the via-hole conductors 50 and to improve the transmission characteristics. In this case, too, the recessed portions H may be filled with a material having a dielectric constant smaller than that of the insulating board 24, as a matter of course.

When the ground layer 7 is to be formed in the dielectric board 2 in the mounting structure shown in FIG. 10, it is desired that suitable holes are formed in the ground layer 7, so that the through-hole conductors 50 will not come in contact with the ground layer 7.

In the above-mentioned invention, the dielectric board 2 of the high-frequency package 1 and the insulating board 24 of the external circuit board 23 are made of ceramics such as alumina ($Al_2O_3$), glass ceramics, aluminum nitride (AlN), mullite, silicon nitride ($Si_3N_4$), or a known insulating material such as an organic insulating material containing an organic resin.

Moreover, the lines, ground layers and wiring layers can be formed of a known electrically conducting material such as W, Mo, Mo—Mn, Cu, Au or Ag. In order to decrease the transmission loss of high-frequency signals, in particular, it is desired that a conductor having a small resistance such as Ag, Cu or Au is used as the lines. When the lines are formed by using these small-resistance conductors, furthermore, it is desired to form the dielectric board 2 by using a low-temperature firing material such as glass ceramics that can be fired at a temperature of from about 800 to about 1000° C. Use of the low-temperature firing material makes it possible to form the dielectric board 2 and the lines at one time through the simultaneous firing.

The invention will now be described by way of Examples.

EXPERIMENT 1

A first signal transmission line, a second signal transmission line and a ground layer of copper were formed on a dielectric board of a glass ceramic having a dielectric constant of 5.6 and a dielectric loss of $29.0\times10^{-4}$ (as measured at a frequency of 60 GHz), and the surfaces of the first and second signal lines were plated with gold to prepare a semiconductor package for use at high frequencies. The package possessed substantially the same structure as the package 1 shown in FIG. 1 but having no via-hole conductor 15.

Next, an external circuit board was formed by using an insulating board made of an alumina ceramic having a dielectric constant of 9.8 and a dielectric loss of $3.0\times10^{-4}$ (as measured at a frequency of 60 GHz) and having a ground layer of tungsten, and by forming wiring layers of coplanar lines with ground by using copper and gold relying on the thin-film method. Recessed portions, each measuring 1.8 mm wide, 2.0 mm long and 0.8 mm high, were formed in the external circuit board at positions so as to be opposed to the electromagnetically coupled portions based on the slots when the package was mounted.

Next, a paste-like eutectic solder was applied by screen-printing onto predetermined portions on the bottom surface of the dielectric board of the thus formed package. The package was then placed on the wiring layer of the external circuit board, and the eutectic solder was caused to reflow at a temperature of about 200° C. thereby to mount the package on the surface of the external circuit board.

The portion where the package was mounted on the external circuit board was measured for its transmission characteristics by using a network analyzer. The measuring portion was from where the semiconductor element was placed on the package up to a wiring layer on the external circuit board, and the first signal transmission line for measurement was changed from the microstrip line into a coplanar line with ground in the portion where the semiconductor element was mounted. The results were as shown in FIG. 12.

Figure 12:
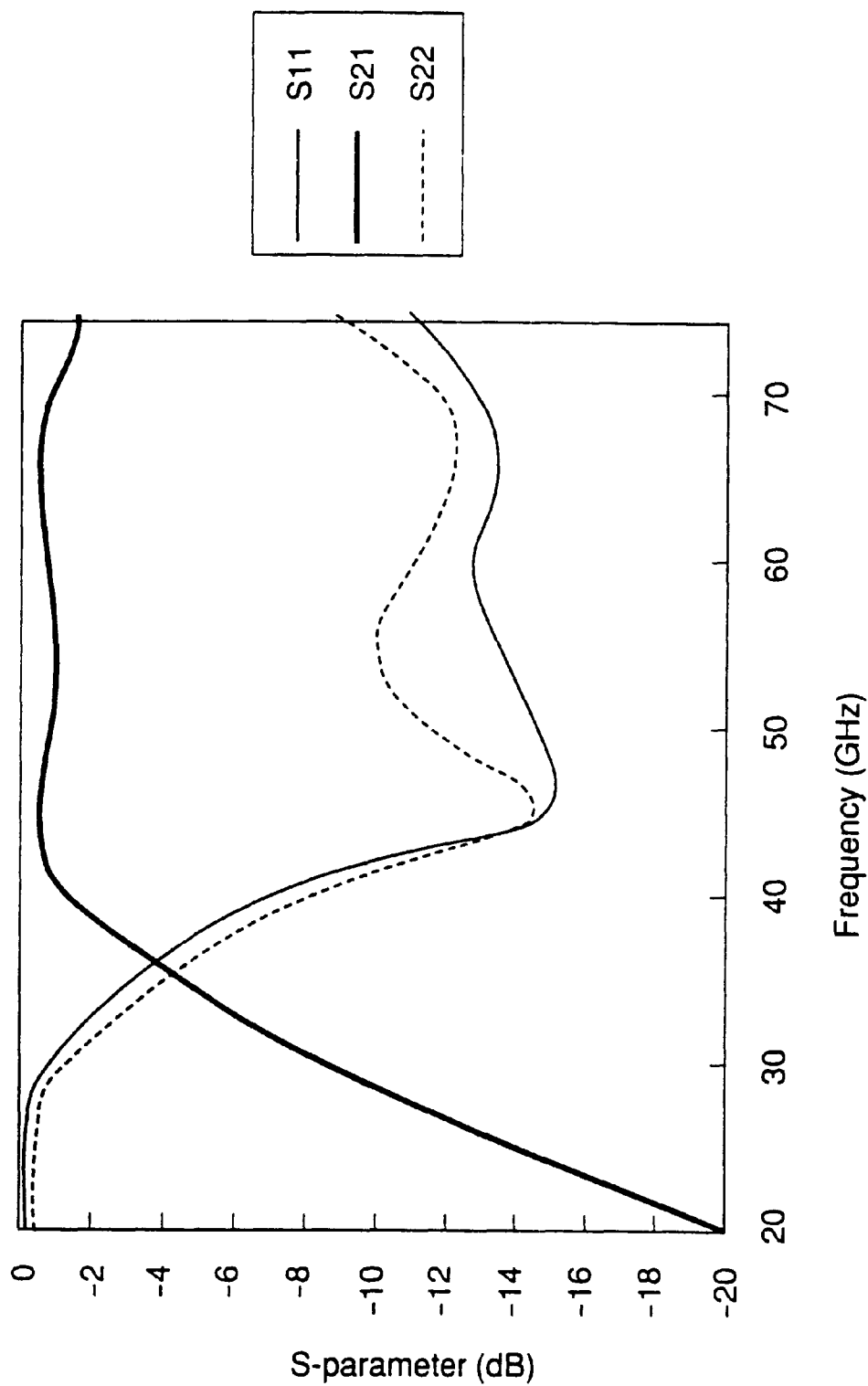
FIG. 12 is a diagram illustrating the transmission characteristics of a structure (present invention) for mounting the high-frequency package on the external circuit board prepared according to Experiment 1.

It will be understood from the results of FIG. 12 that in a frequency range of from 45 GHz to 65 Ghz, the transmission characteristic of S11 was not larger than −10 dB and the transmission characteristic of S21 was not smaller than −1.2.

EXPERIMENT 2 (Comparative Example)

The package was mounted on the surface of the external circuit board in quite the same manner as in Experiment 1 but forming no recessed portion in the external circuit board, and the transmission characteristics were measured in the same manner as in Experiment 1. The results were as shown in FIG. 13. From FIG. 13, it was learned that when no recessed portion was formed in the external circuit board, the transmission characteristic of S21 decreased strikingly over a frequency range of from 60 GHz to 65 GHz, making it difficult to transmit high-frequency signals to the semiconductor element.

EXPERIMENT 3

A high-frequency package of the same structure as that of Experiment 1 was prepared by using a dielectric board made of an alumina ceramic having a dielectric constant of 8.9 and a dielectric loss of $1.5\times10^{-3}$ (as measured at a frequency of 8.6 GHz).

Next, the external circuit board was prepared in the same manner as in Experiment 1 but forming recessed portions in a size measuring 4 cm wide, 4 cm long and 0.8 mm deep. The recessed portions were filled with a polytetrafluoroethylene having a dielectric constant of 2.3.

The high-frequency package was mounted on the external circuit board in the same manner as in Experiment 1, and the transmission characteristics were measured in the same manner as in Experiment 1 to find that the transmission characteristic of S11 was −13.5 dB and the transmission characteristic of S21 was −1.3 dB at a frequency of 20 GHz.

The above-mentioned high-frequency package was mounted on the external circuit board without forming any recessed portion therein, and the transmission characteristics were measure to find that the transmission characteristic of S11 was −3.5 dB and the transmission characteristic of S21 was −4.8 dB at a frequency of 20 GHz, which was a drop in the transmission characteristics.

EXPERIMENT 4

A high-frequency package of the structure shown in FIG. 1 was prepared by using a dielectric board of alumina having a dielectric constant of 8.9 and a dielectric loss of $15.0\times10^{-4}$ (as measured at a frequency of 12 GHz), by forming lines, ground layers, conducting pads and via-hole conductors of tungsten, and by plating the exposed surfaces of the conductors with gold.

The high-frequency package possessed an open end length (distance x from the center of the slot to the end) of the microstrip line of 0.80 mm, long diameter L of the slot of 2.0 mm, and a short diameter M of the slot of 0.20 mm, so that high-frequency signals could be transmitted. In order to evaluate the transmission characteristics, furthermore, a connection board of alumina having a dielectric constant of 9.8 and a dielectric loss of $1.5\times10^{-4}$ (as measured at a frequency of 12.5 GHz) on which have been formed microstrip lines of gold-plated copper, was mounted instead of the high-frequency element mounted on the surface of the package, and the first input line 6a and the first output line 6b were connected together through this connection board.

Next, an external circuit board was prepared by using an insulating board which comprises alumina having a dielectric constant of 9.8 and a dielectric loss of $1.5\times10^{-4}$ (as measured at a frequency of 12.5 Ghz) and has a ground layer of tungsten therein, by forming the lines, wiring layer for power source and conducting pads all by Cu-sputtering, and by plating gold thereon. In the external circuit board were formed recessed portions of the same size as those of Experiment 1 just under the slots formed in the portions on where the high-frequency package was mounted.

The above-mentioned high-frequency package was mounted on the thus obtained external circuit board in the same manner as in Experiment 1, and the transmission characteristics were measured by using the network analyzer.

The measurement was taken between the third input line 25a and the third output line 25b on the external circuit board.

Furthermore, the isolation characteristics at a frequency of 60 GHz were measured by changing the distances between the positions of the via-hole conductors 15 and the centers of the slots 9a, 9b in the package. The isolation characteristics were measured between the third input line 25a and the third output line 25b on the external circuit board by removing the connection board. The results were as shown in Table 1.

TABLE 1

| Sample No. | Distance from center of slot to via-hole conductor note 1) | Distance from center of slot to connection portion note 1) | Isolation (without connection board) | | Transmission characteristics (with connection board) | |
|---|---|---|---|---|---|---|
| 1 | 3.2 L | 3.1 L | −0.6 | −31.5 | −21.0 | −1.9 |
| 2 | 2.5 L | 2.4 L | −0.8 | −30.8 | −20.6 | −2.1 |
| 3 | 1.4 L | 1.3 L | −1.2 | −28.6 | −18.5 | −2.3 |
| 4 | 0.9 L | 0.8 L | −1.9 | −23.1 | −4.6 | −8.5 |
| 5 | without via-hole conductor | 3.1 L | −2.5 | −14.3 | −19.3 | −2.2 | note 1): L is a long diameter of the slot.

As shown in Table 1, it was learned that when the via-hole conductors and the solder connection portions were formed in the regions away from the centers of the slots by more than L (1.75 mm), the isolation characteristics of smaller than −25 dB could be maintained, and improved transmission characteristics were obtained.

We claim:

1. A structure for mounting a high-frequency semiconductor element and transmitting a signal to and from the semiconductor element, comprising:

a dielectric board having parallel first and second surfaces, wherein the high-frequency semiconductor element is mounted in a cavity formed adjacent the first surface of the dielectric board;

a first signal transmission line formed on the first surface of the dielectric board and electrically connectable to the high-frequency semiconductor element;

a second signal transmission line formed on the second surface of the dielectric board, the first and second signal transmission lines overlap each other in an overlapping region when viewed in a direction perpendicular to the first and second surfaces of the dielectric board;

an insulating board having a wiring layer formed on a surface thereof, wherein the dielectric board is mounted on the surface of the insulating board and the wiring layer is electrically connected to the second signal transmission line, the insulating board defining a recess at the surface thereof which overlaps the overlapping region of the first and second signal transmission lines when viewed in a direction perpendicular to the surface of the insulating board.

2. A structure for mounting according to claim 1, wherein the first signal transmission line and the second signal transmission line are electromagnetically coupled together through a slot formed in a ground layer provided in said dielectric board.

3. A structure for mounting according to claim 1, wherein the first signal transmission line and the second signal transmission line are coupled together through a via-hole conductor that is penetrating through said dielectric board.

4. A structure for mounting according to claim 1, wherein the recess is filled with a material having a dielectric constant smaller than that of said insulating board.

5. A structure for mounting according to claim 4, wherein said material that is filled has a dielectric constant of not larger than 3.0.

6. A structure for mounting according to claim 2, wherein:

said first signal transmission line includes a first input line and a first output line, and a first end of said first input line and a first end of said first output line are electrically connected to the semiconductor element;

said second signal transmission line includes a second input line and a second output line;

said slot formed in said ground layer includes an input-slot and an output-slot; and a second end of said first input line is electromagnetically coupled to an end of said second input line through the input-slot, and a second end of said first output line is electromagnetically coupled to an end of said second output line through the output-slot.

7. A structure for mounting according to claim 6, wherein:

said input-slot and said output-slot are of a rectangular shape or an oval shape having a long side L or a long axis L, the distance between the centers thereof being not smaller than 2L; and a via-hole conductor or a metal band connected to said ground layer is formed in a region separated away by not smaller than L from the centers of said input-slot and said output-slot.

8. A structure for mounting according to claim 6, wherein said via-hole conductor or said metal band is positioned on a straight line connecting the end of the second input line to the end of the second output line.

9. A structure for mounting according to claim 6, wherein said via-hole conductor or said metal band is formed in a plural number maintaining such a gap as to shield the electromagnetic waves.

10. A structure for mounting according to claim 9, wherein said plural number via-hole conductors or said plural number metal bands are so formed as to surround the ends of the second input line and of the second output line.

11. A structure for mounting according to claim 6, wherein said second input line and said second output line are connected to the wiring layers at points separated by a distance not smaller than L from centers of the input-slot and the output-slot.

12. A structure for mounting according to claim 1, wherein a ground layer is formed in the insulating board to constitute a microstrip line in combination with the wiring layer formed on the surface thereof, wherein a ground layer is formed in the dielectric board to constitute a microstrip line in combination with the second signal transmission lines and the ground layers in the dielectric board and the ground layer in the insulating board are electrically joined together through via-hole conductors or electrically conducting cutaway portions formed in the dielectric board and the insulating board and aligned with each other.

* * * * *